(12) United States Patent
Heine

(10) Patent No.: US 9,172,159 B2
(45) Date of Patent: Oct. 27, 2015

(54) PROCESS FOR THE PRODUCTION OF A PLUG AND A PLUG

(71) Applicant: Sennheiser electronic GmbH & Co. KG, Wedemark (DE)

(72) Inventor: Lars Heine, Schwuelper (DE)

(73) Assignee: Sennheiser electronics GmbH & Co. KG, Wedemark (DE)

( * ) Notice: Subject to any disclaimer, the term of this patent is extended or adjusted under 35 U.S.C. 154(b) by 191 days.

(21) Appl. No.: 13/948,223

(22) Filed: Jul. 23, 2013

(65) Prior Publication Data

US 2014/0162500 A1    Jun. 12, 2014

(30) Foreign Application Priority Data

Jul. 23, 2012  (DE) .................. 10 2012 212 881

(51) Int. Cl.
*H01R 12/00* (2006.01)
*H01R 12/57* (2011.01)
*H01R 43/02* (2006.01)
*H05K 3/00* (2006.01)
*H05K 3/34* (2006.01)

(52) U.S. Cl.
CPC ............ *H01R 12/57* (2013.01); *H01R 43/0256* (2013.01); *H05K 3/0052* (2013.01); *H05K 3/3405* (2013.01); *H05K 2201/10189* (2013.01); *H05K 2203/308* (2013.01); *Y10T 29/49213* (2015.01)

(58) Field of Classification Search
USPC ................................................... 439/79, 76.1
IPC ...... H01R 23/7073, 23/7068, 23/6873, 13/6658, H01R 13/658
See application file for complete search history.

(56) References Cited

U.S. PATENT DOCUMENTS

| | | | |
|---|---|---|---|
| 2,905,921 | A | 10/1957 | Barwick |
| 6,305,983 | B1 * | 10/2001 | Harting et al. ........... 439/607.32 |
| 6,416,335 | B1 * | 7/2002 | Horchler .......................... 439/79 |
| 6,568,944 | B1 * | 5/2003 | Meyer et al. ..................... 439/79 |
| 7,500,855 | B2 | 3/2009 | Kari |
| 8,152,534 | B1 | 4/2012 | Li et al. |
| 8,485,851 | B2 * | 7/2013 | Kondo et al. .................. 439/660 |
| 2006/0148314 | A1 | 7/2006 | Castaneda et al. |
| 2010/0055942 | A1 | 3/2010 | Huang |
| 2011/0269324 | A1 | 11/2011 | Ko |

FOREIGN PATENT DOCUMENTS

| | | |
|---|---|---|
| DE | 20 2006 010 297 | 12/2006 |
| DE | 10 2006 058 569 | 6/2008 |

* cited by examiner

*Primary Examiner* — Hien Vu
(74) *Attorney, Agent, or Firm* — Frommer Lawrence & Haug LLP

(57) ABSTRACT

A process for the production of a plug, in which a circuit board panel with openings is provided for forming a circuit board. A plug insert, having a plurality of pins and a plurality of plug contact surfaces, is then placed in one of the openings, by means of an automatic SMD fitment device, in such a way that at least one pin of the plug rests on the circuit board panel, and at least two plug contact surfaces, which are electrically connected to the pins, rest on the circuit board, with the contact surfaces of the plug being on one plane. The plug contact surfaces are then automatically soldered to at least one of the contact surfaces of the circuit board.

8 Claims, 2 Drawing Sheets

PROCESS FOR THE PRODUCTION OF A PLUG AND A PLUG

The present application claims priority from German Patent Application No. DE 10 2012 212 881.6 filed on Jul. 23, 2012, the disclosure of which is incorporated herein by reference in its entirety.

FIELD OF THE INVENTION

The present invention concerns a process for the production of a plug and a plug.

It is noted that citation or identification of any document in this application is not an admission that such document is available as prior art to the present invention.

Plugs such as for example XLR plugs are typically fixed on or to a circuit board by manual soldering. Manual soldering is both susceptible to error and also cost-intensive.

US 2011/0269324 A1 shows a plug contact which is mounted and soldered by means of SMD technology.

It is noted that in this disclosure and particularly in the claims and/or paragraphs, terms such as "comprises", "comprised", "comprising" and the like can have the meaning attributed to it in U.S. Patent law; e.g., they can mean "includes", "included", "including", and the like; and that terms such as "consisting essentially of" and "consists essentially of" have the meaning ascribed to them in U.S. Patent law, e.g., they allow for elements not explicitly recited, but exclude elements that are found in the prior art or that affect a basic or novel characteristic of the invention.

It is further noted that the invention does not intend to encompass within the scope of the invention any previously disclosed product, process of making the product or method of using the product, which meets the written description and enablement requirements of the USPTO (35 U.S.C. 112, first paragraph) or the EPO (Article 83 of the EPC), such that applicant(s) reserve the right to disclaim, and hereby disclose a disclaimer of, any previously described product, method of making the product, or process of using the product.

SUMMARY OF THE INVENTION

Therefore an object of the invention is to provide an inexpensive process for the production of a plug and a correspondingly produced plug.

Thus there is provided a process for the production of a plug. A circuit board panel is provided. Openings are provided in the circuit board panel for forming a circuit board. A plug insert with at least one pin and at least one plug contact surface is placed by means of an automatic SMD fitment device in one of the openings in such a way that at least one pin of the plug rests on the circuit board panel and at least two plug contact surfaces which are electrically connected to the pin rest on the circuit board. The contact surfaces of the plug are on one plane. The contact surfaces are automatically soldered to one of the contact surfaces of the circuit board.

In an aspect of the invention the underside of the pins is on a plane with the underside of the contact surfaces. The invention also concerns an SMD-mounted plug. The plug has an SMD contact plane and contacts on both sides of the SMD contact plane.

In an aspect of the invention the contacts are arranged laterally on the SMD contact plane in the form of a circuit board.

The invention concerns the idea of producing or contacting a plug by an SMD process. The advantage of an SMD process is that equipping the respective circuit boards can be effected automatically.

In accordance with the invention a plug insert is placed in an opening in a circuit board panel for contacting the plug insert with a circuit board. In that case pins of the plug can rest on at least a portion of the circuit board panel, while optionally contact surfaces or contact pins of the plug insert rest on the circuit board. This can be effected by an automatic SMD fitment device. Then the contact surfaces of the plug can be connected to the corresponding contact surfaces on the circuit board. This can be effected for example by an automatic soldering process.

In an aspect of the invention the plane of the circuit board panel corresponds to the plane of the circuit board. After the plug insert has been contacted with the circuit board, the circuit board panel can be broken off.

In an aspect of the invention the plane of at least one pin of the plug insert corresponds to the plane of the underside of the contact surfaces.

According to the invention the plugs can represent XLR3 pole female plugs, XCR5 pole female plugs, RJ45 Ethernet/AVB plugs or USB plugs.

DETAILED DESCRIPTION OF EMBODIMENTS

It is to be understood that the figures and descriptions of the present invention have been simplified to illustrate elements that are relevant for a clear understanding of the present invention, while eliminating, for purposes of clarity, many other elements which axe conventional in this art. Those of ordinary skill in the art will recognize that other elements are desirable for implementing the present invention. However, because such elements are well known in the art, and because they do not facilitate a better understanding of the present invention, a discussion of such elements is not provided herein.

The present invention will now be described in detail on the basis of exemplary embodiments.

Figure 1:
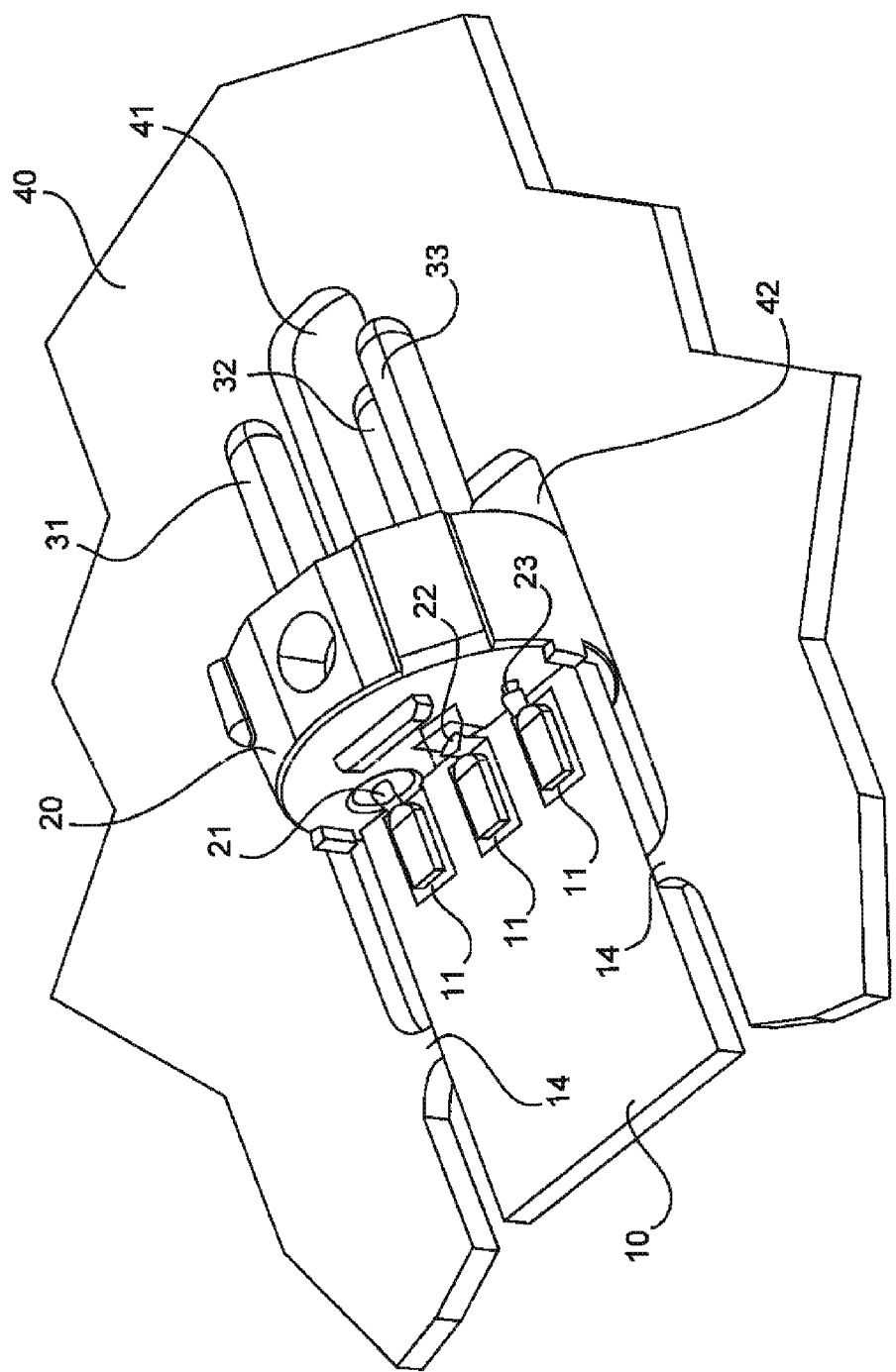
FIG. 1 shows a diagrammatic perspective view of a circuit board panel and a plug insert during production of a plug according to a first embodiment of the invention.

FIG. 1 shows a diagrammatic perspective view of a circuit board panel and a plug insert during production of a plug according to a first embodiment of the invention. A circuit board panel 40 has at least one opening 41 for receiving a pin 32 of a plug 20. There are also further openings 42 so that a circuit board 10 is connected to the circuit board panel 40 only by two portions or attachments 14. A plurality of contact surfaces 11 are provided on the circuit board 10. A plug insert 20 is placed by means of an automatic SMD fitment device in the opening 42 and in particular the opening 41 in the circuit board panel 40. An XLR plug insert is provided in the first embodiment. That plug insert has three pins 31, 32 and 33, the second pin 32 being introduced into the opening 41. The underside of the pins 31, 32 rests on the top side of the circuit board panel 40.

The plug insert 20 also has for example three contact surfaces or contact pins 21, 22 and 23. Upon insertion of the plug insert 20 the contact surfaces 21, 22 and 23 are placed on the electric contact surfaces 11 on the circuit board 10. The underside of the contact surfaces 21, 22, 23 is on one plane or at one height with the underside of the pins 31, 32. The circuit board 10 is also on the same plane as the circuit board panel 40. The contact surface 22 for the pin 32 which has been introduced into the opening 41 is guided from a plane beneath the circuit board 10 to a plane corresponding to that of the circuit board 10 so that the contact surface 22 can be placed on a contact surface 11 of the circuit board 10.

The contact surfaces can then be contacted by an automatic soldering process on the electric contact surfaces 11. The circuit board panel 40 can then be removed so that only the circuit board 10 together with the plug insert 20 remains.

Figure 2:
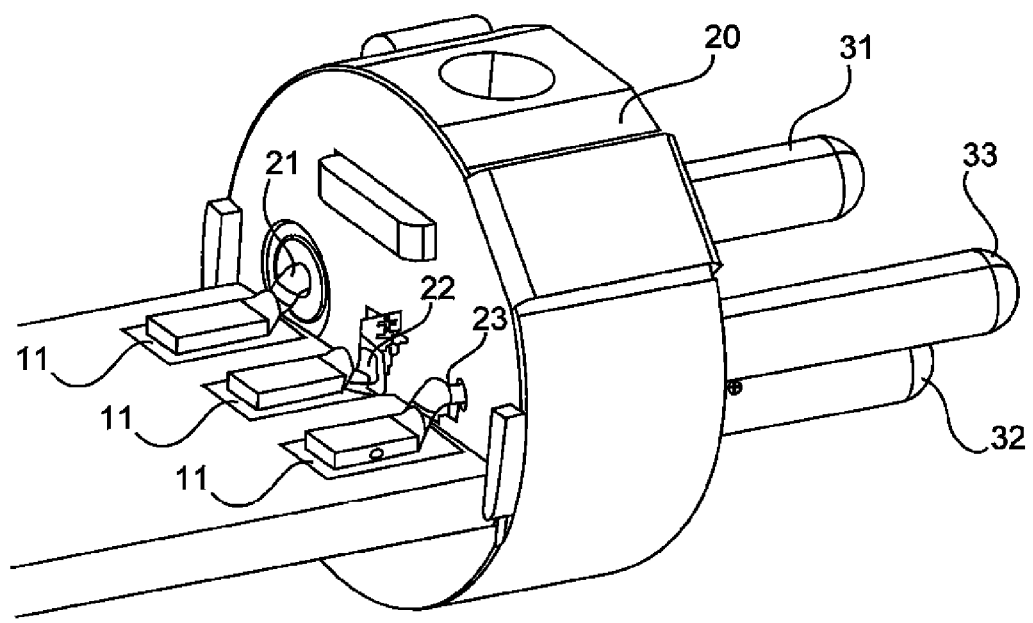
FIG. 2 shows a perspective view of a plug according to the first embodiment.

FIG. 2 shows a perspective view of a plug according to the first embodiment. FIG. 2 shows the plug according to the invention. In this case the plug unit has a circuit board 10 and a plug insert 20 with pins 31, 32, 33. The width of the circuit board 10 is no greater in this case than the width of the plug insert. It is however also possible for the width of the circuit board 10 to be greater than the width of the plug. That makes it possible to provide a very narrow plug, wherein the delimiting size of the plug only represents the outside dimension of the plug insert 20. In the first embodiment the lower sides of the contact surfaces 21, 22 and 23 are on one plane and are respectively placed on one of the contact surfaces 11 on the circuit board 10 so that suitable contacting can be effected by means of an automatic soldering process.

According to the invention XLR3 pole female plugs, XLR5 female plugs, RJ45 Ethernet/AVB plugs and USB plug devices can be produced.

According to the invention all contact surfaces 21, 22, 23 for contacting the pins of the plug are guided on to one plane so that contacting to the circuit board 10 can be effected by an automatic SMD fitment device. According to the invention the plug insert 20 is provided at an end of the circuit board 10 and connected to the contact surfaces 11 on the circuit board by the contact surfaces 21, 22 and 23. Alternatively to the end of the circuit board the plug insert can also be provided laterally on the circuit board 10.

A plug having a casing of minimal dimensions can be provided with the process according to the invention for the production of a plug and with the plug produced according to the invention, wherein an SMD-equipped circuit board is within the dimensions of the casing. In other words the width of the circuit board can correspond to the width of the plug insert.

Boosters and/or impedance transformer circuits with a symmetrical or asymmetrical output stage can be provided on the circuit board 10. Alternatively or additionally thereto an analog/digital converter circuit can also be provided. Typically the circuits can be supplied with power by an external power supply, for example a 48V phantom feed.

A plug according to the invention (XLR plug) has plug contacts 31, 32, 33 on both sides of the SMD contact plane. In that case the plug contacts (pins) 31, 33 can be provided above the circuit board and the plug contact 32 below the circuit board. That can be achieved by the plug 20 being provided in the opening 42. Thus according to the invention there can be provided a plug of minimal dimensions for its casing. The dimensions are substantially defined by the arrangement of the plug contacts.

While this invention has been described in conjunction with the specific embodiments outlined above, it is evident that many alternatives, modifications, and variations will be apparent to those skilled in the art. Accordingly, the preferred embodiments of the invention as set forth above are intended to be illustrative, not limiting. Various changes may be made without departing from the spirit and scope of the inventions as defined in the following claims.

The invention claimed is:

1. A process for the production of a plug comprising:
providing a circuit board panel;
providing openings in the circuit board panel, with at least one of the openings for mounting a circuit board therein;
placing a plug insert, having a plurality of pins and a plurality of plug contact surfaces, in one of the openings, by means of an automatic SMD fitment device, in such a way that:
at least one pin of the plug rests on the circuit board panel; and
at least two plug contact surfaces, which are respectively electrically connected to at least two of the pins, rest on the circuit board;
wherein the plug contact surfaces of the plug are on one plane; and automatically soldering the plug contact surfaces to the at least one contact surface of the circuit board.

2. The process as set forth in claim 1;
wherein the undersides of the pins lie on one plane along with undersides of the plug contact surfaces.

3. The process as set forth in claim 1;
wherein the plug represents an XLR3 pole female plug, an XCR5 pole female plug, an RJ45 Ethernet plug, or a USB plug.

4. The process as set forth in claim 2;
wherein the plug represents an XLR3 pole female plug, an XCR5 pole female plug, an RJ45 Ethernet plug, or a USB plug.

5. A surface-mounted-device (SMD) mounted plug comprising:
a circuit board panel comprising:
at last one surface which forms an SMD contact plane; and openings; and
a plug insert comprising:
a plurality of pins, where at least one pin of the plurality of pins is arranged on each side of the SMD contact plane; and
a plurality of plug contact surfaces;
wherein the plug insert is arranged in one of the openings of the circuit board panel in such a way that:
at least one pin of the plug rests on the circuit board panel; and
at least two plug contact surfaces, which are respectively electrically connected to at least two of the pins, rest on a circuit board;
wherein the plug contact surfaces of the plug are on one plane; and
wherein the plug contact surfaces are soldered to at least one contact surface of the circuit board.

6. The plug as set forth in claim 5;
wherein the contact surface of the circuit board is arranged laterally on the SMD contact plane.

7. The plug as set forth in claim 5;
wherein the plug represents an XLR3 pole female plug, an XCR5 pole female plug, an RJ45 Ethernet plug or an USB plug.

8. The plug as set forth in claim 6;
wherein the plug represents an XLR3 pole female plug, an XCR5 pole female plug, an RJ45 Ethernet plug or an USB plug.

* * * * *

UNITED STATES PATENT AND TRADEMARK OFFICE
CERTIFICATE OF CORRECTION

| | | |
|---|---|---|
| PATENT NO. | : 9,172,159 B2 | Page 1 of 1 |
| APPLICATION NO. | : 13/948223 | |
| DATED | : October 27, 2015 | |
| INVENTOR(S) | : Lars Heine | |

It is certified that error appears in the above-identified patent and that said Letters Patent is hereby corrected as shown below:

Title Page, item (73), please correct the Assignee to read -- Sennheiser electronic GmbH & Co. KG -- instead of "Sennheiser electronics GmbH & Co. KG"

Signed and Sealed this
Ninth Day of August, 2016

Michelle K. Lee
*Director of the United States Patent and Trademark Office*